United States Patent
Ichimura et al.

(10) Patent No.: US 10,332,975 B2
(45) Date of Patent: Jun. 25, 2019

(54) EPITAXIAL SUBSTRATE FOR SEMICONDUCTOR DEVICE AND METHOD FOR MANUFACTURING SAME

(71) Applicant: NGK INSULATORS, LTD., Nagoya-shi, Aichi (JP)

(72) Inventors: Mikiya Ichimura, Ichinomiya (JP); Sota Maehara, Nagoya (JP); Yoshitaka Kuraoka, Okazaki (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 15/468,309

(22) Filed: Mar. 24, 2017

(65) Prior Publication Data
US 2017/0200806 A1 Jul. 13, 2017

Related U.S. Application Data

(63) Continuation of application No. PCT/JP2015/070755, filed on Jul. 22, 2015.

(30) Foreign Application Priority Data

Oct. 3, 2014 (JP) .................................. 2014-204683

(51) Int. Cl.
*H01L 29/66* (2006.01)
*H01L 21/02* (2006.01)
(Continued)

(52) U.S. Cl.
CPC .... *H01L 29/66462* (2013.01); *H01L 21/0243* (2013.01); *H01L 21/0254* (2013.01);
(Continued)

(58) Field of Classification Search
CPC ......... H01L 29/66462; H01L 21/02458; H01L 21/02433; H01L 21/0262; H01L 21/0243;
(Continued)

(56) References Cited

U.S. PATENT DOCUMENTS 7,045,879 B2 * 5/2006 Hisada ................ H01L 21/3247
257/289
7,326,963 B2 * 2/2008 Gaska .................... B82Y 20/00
257/79
(Continued)

FOREIGN PATENT DOCUMENTS

JP  2002-520880 A   7/2002
JP  2002-329665 A   11/2002
(Continued)

OTHER PUBLICATIONS

International Preliminary Report on Patentability for PCT Patent App. No. PCT/JP2015/070755 (dated Apr. 4, 2017) with English language translation thereof.
(Continued)

*Primary Examiner* — William Coleman
(74) *Attorney, Agent, or Firm* — Cermak Nakajima & McGowan LLP; Tomoko Nakajima

(57) ABSTRACT

Provided is a group 13 nitride epitaxial substrate with which the HEMT device having superior characteristics can be manufactured. This epitaxial substrate is provided with: a base substrate composed of SiC and having a main surface with a (0001) plane orientation; a nucleation layer formed on one main surface of the base substrate and composed of AlN; an electron transit layer formed on the nucleation layer and composed of a group 13 nitride with the composition $Al_yGa_{1-y}N$ ($0 \leq y < 1$); and a barrier layer formed on the electron transit layer and composed of a group 13 nitride with the composition $In_zAl_{1-z}N$ ($0.13 \leq z \leq 0.23$) or $Al_wGa_{1-w}N$ ($0.15 \leq w \leq 0.35$). The (0001) plane of the base substrate has an off angle of 0.1° or more and 0.5° or less, and an intermediate layer composed of a group 13 nitride with the composition $Al_xGa_{1-x}N$ ($0.01 \leq x \leq 0.4$) is further provided between the nucleation layer and the electron transit layer.

8 Claims, 7 Drawing Sheets

(51) Int. Cl.
*H01L 29/16* (2006.01)
*H01L 29/20* (2006.01)
*H01L 29/205* (2006.01)
*H01L 29/267* (2006.01)
*H01L 29/778* (2006.01)

(52) U.S. Cl.
CPC .... *H01L 21/0262* (2013.01); *H01L 21/02378* (2013.01); *H01L 21/02433* (2013.01); *H01L 21/02458* (2013.01); *H01L 21/02505* (2013.01); *H01L 29/1608* (2013.01); *H01L 29/2003* (2013.01); *H01L 29/205* (2013.01); *H01L 29/267* (2013.01); *H01L 29/66068* (2013.01); *H01L 29/7786* (2013.01)

(58) Field of Classification Search
CPC ............. H01L 29/1608; H01L 29/2003; H01L 29/205; H01L 21/02378; H01L 21/0254; H01L 29/66068; H01L 29/267
See application file for complete search history.

(56) References Cited

U.S. PATENT DOCUMENTS

| | | | |
|---|---|---|---|
| 7,566,580 B2 * | 7/2009 | Keller | C30B 25/02 438/46 |
| 7,638,819 B2 | 12/2009 | Kikkawa et al. | |
| 7,691,658 B2 * | 4/2010 | Kaeding | C30B 23/025 257/12 |
| 7,838,903 B2 | 11/2010 | Kikkawa et al. | |
| 8,310,029 B2 * | 11/2012 | Fujikura | C30B 25/183 257/615 |
| 8,455,885 B2 * | 6/2013 | Keller | C30B 25/02 257/103 |
| 8,742,426 B2 | 6/2014 | Nakata et al. | |
| 8,823,015 B2 * | 9/2014 | Momose | C30B 25/20 257/77 |
| 8,853,829 B2 * | 10/2014 | Miyoshi | C23C 16/303 257/615 |
| 2003/0047129 A1 * | 3/2003 | Kawahara | C30B 25/02 117/2 |
| 2006/0043396 A1 * | 3/2006 | Tsuda | H01L 29/045 257/94 |
| 2011/0006310 A1 * | 1/2011 | Nagasawa | H01L 29/045 257/77 |
| 2017/0365700 A1 * | 12/2017 | Beam, III | H01L 29/36 |

FOREIGN PATENT DOCUMENTS

| | | |
|---|---|---|
| JP | 2004-335635 A | 5/2003 |
| JP | 2003-229439 A | 8/2003 |
| JP | 2006-147663 A | 6/2006 |
| JP | 2007-165431 A | 6/2007 |
| JP | 2012-033575 A | 2/2012 |
| JP | 2013-033877 A | 2/2013 |
| JP | 2013-187368 A | 9/2013 |
| WO | WO00/04587 A2 | 1/2000 |

OTHER PUBLICATIONS

Office Action from Japanese Patent App. No. 2015-560886 (dated Jul. 12, 2016).
International Search Report for PCT Patent App. No. PCT/JP2015/070755 (dated Sep. 29, 2015).

* cited by examiner

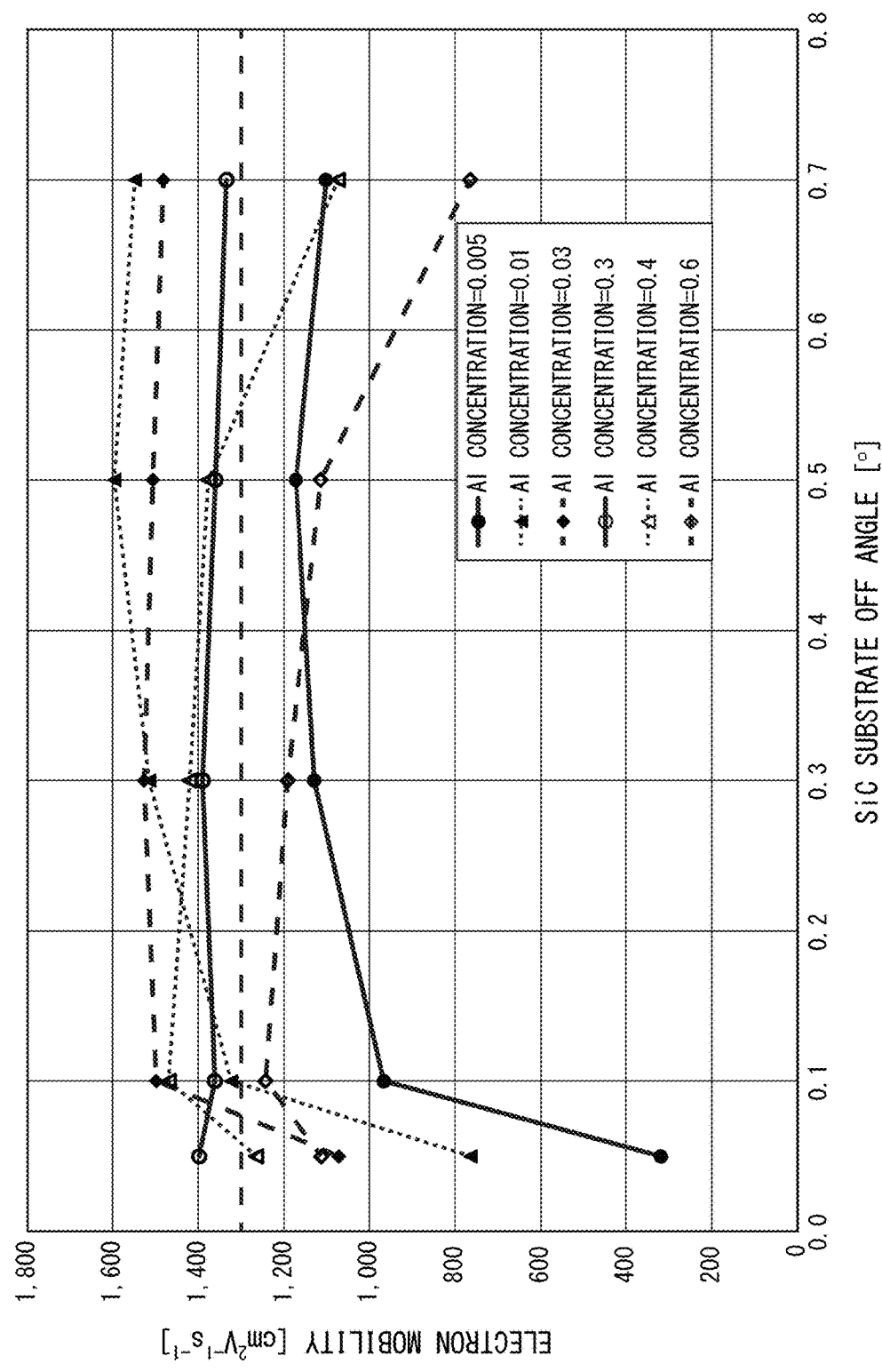
F I G. 2

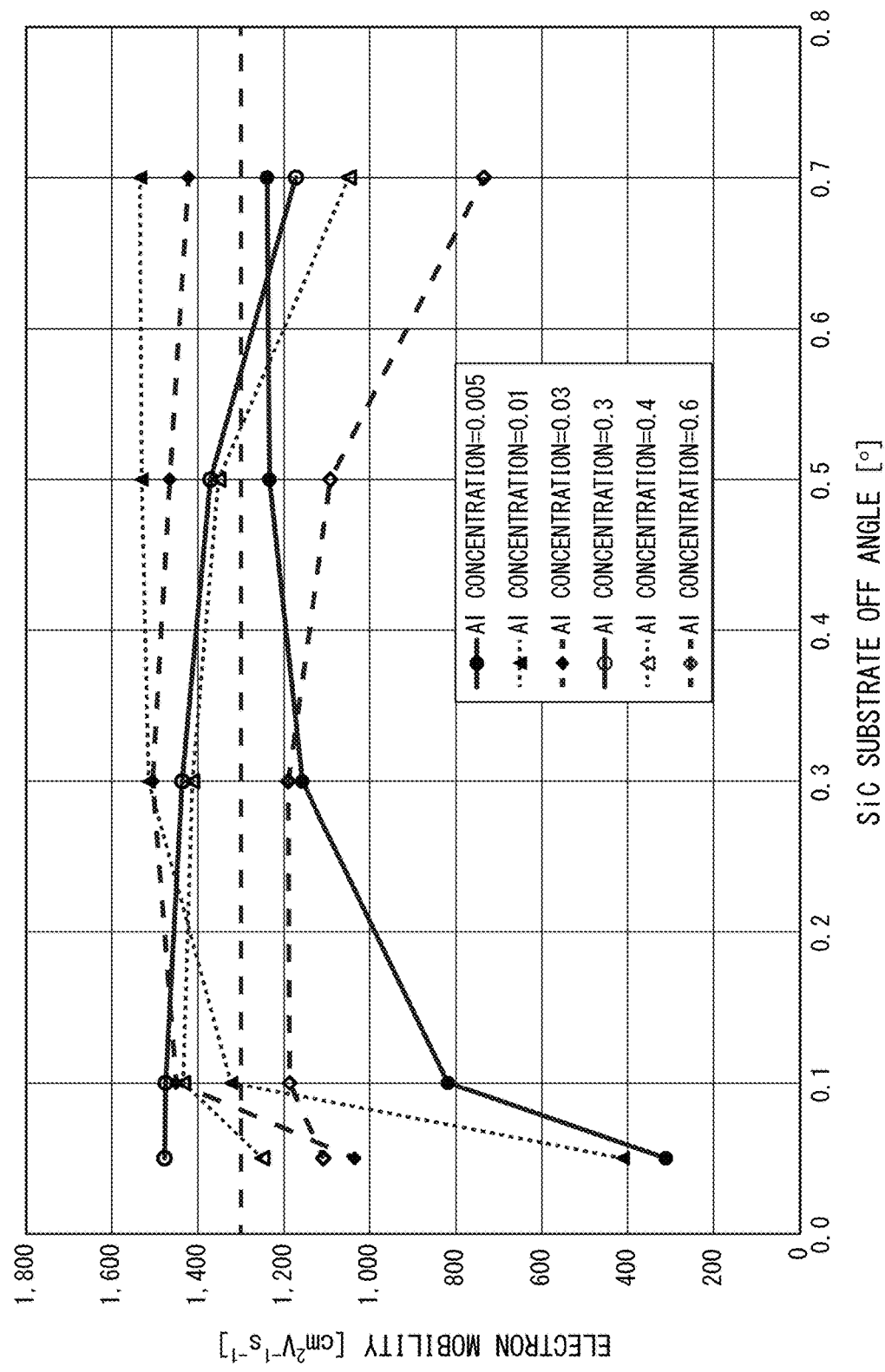
F I G. 3

EPITAXIAL SUBSTRATE FOR SEMICONDUCTOR DEVICE AND METHOD FOR MANUFACTURING SAME

BACKGROUND OF THE INVENTION

Field of the Invention

The present invention relates to an epitaxial substrate having a group 13 nitride layer epitaxially formed on a base substrate, and more particularly to an epitaxial substrate for an HEMT device.

Description of the Background Art

A group 13 nitride epitaxial substrate for an HEMT device in which an HEMT structure is formed of a group 13 nitride epitaxial film on a SiC substrate is already known in the art as a high electron mobility transistor (HEMT) device. For example, Japanese Unexamined Patent Application Publication (Translation of PCT Application) No. 2002-520880 discloses an epitaxial film having an HEMT structure in which an AlN buffer layer and an insulating GaN layer are formed in this order on a semi-insulating SiC substrate.

In order that an HEMT device may have, for example, a high performance such as high output, low loss and high-frequency operation as well as a high reliability, the HEMT device must be provided with characteristics such as high mutual conductance, high maximum drain current, low on-resistance, low leakage current, low current collapse, high cut-off frequency and high voltage resistance. Further, in order that these characteristics may be realized, it is demanded that a group 13 nitride epitaxial substrate for the HEMT device has characteristics such as high electron mobility, high sheet carrier density, low surface roughness and high voltage resistance.

With respect to this point, regarding an epitaxial wafer for a high-frequency device such as an HEMT, in the case in which a GaN-based semiconductor layer is grown on an SiC base substrate, it is already known in the art that a sheet resistance variation within the same growth batch or under the same growth conditions can be reduced by setting an off angle of the SiC base substrate to be 0° or more and 0.2° or less. For example, reference is made to Japanese Patent Application Laid-Open No. 2013-187368.

With reference to the disclosed contents of Japanese Unexamined Patent Application Publication (Translation of PCT Application) No. 2002-520880 and Japanese Patent Application Laid-Open No. 2013-187368, the inventors of the present invention fabricated a group 13 nitride epitaxial substrate for an HEMT device by laminating an AlN nucleation layer, a GaN electron transit layer, an AlN spacer layer and an InAlN barrier layer sequentially on a semi-insulating SiC substrate in which the main surface was a (0001) plane and an off angle was 0.1°, and evaluated the characteristics thereof. However, the obtained characteristics of the extent that the electron mobility μ was about 500 $cm^2V^{-1}s^{-1}$ were insufficient. Also, numerous fine pits were found to be generated on a surface of the barrier layer of the obtained epitaxial substrate, suggesting that the presence of such pits had a relationship of some sort to the lowering of the electron mobility.

By considering these results, the inventors of the present invention have made eager studies and have obtained a knowledge that, in order to fabricate a group 13 nitride epitaxial substrate for an HEMT device having superior characteristics, particularly a superior electron mobility, and further to fabricate an HEMT device having superior characteristics, for example, a superior maximum drain current, it is effective to provide an intermediate layer composed of AlGaN between the AlN nucleation layer and the GaN electron transit layer and to adjust the setting of the off angle of the semi-insulating SiC substrate.

SUMMARY OF THE INVENTION

The present invention relates to an epitaxial substrate having a group 13 nitride layer epitaxially formed on a base substrate, and is more particularly directed to an epitaxial substrate for fabricating an HEMT device.

According to the present invention, an epitaxial substrate for a semiconductor device includes: a base substrate composed of SiC and having a main surface with a (0001) plane orientation; a nucleation layer formed on one main surface of the base substrate and composed of AN; an electron transit layer formed on the nucleation layer and composed of a group 13 nitride with a composition $Al_yGa_{1-y}N$ ($0 \leq y < 1$); and a barrier layer formed on the electron transit layer and composed of a group 13 nitride with a composition $In_zAl_{1-z}N$ ($0.13 \leq z \leq 0.23$) or $Al_wGa_{1-w}N$ ($0.15 \leq w \leq 0.35$), wherein a (0001) plane of the base substrate has an off angle of 0.1° or more and 0.5° or less, and an intermediate layer composed of a group 13 nitride with a composition $Al_xGa_{1-x}N$ ($0.01 \leq x \leq 0.4$) is further provided between the nucleation layer and the electron transit layer.

According to the present invention, an epitaxial substrate for fabricating an HEMT device having a large electron mobility can be obtained, and further, an HEMT device having a large maximum drain current can be obtained.

Therefore, an object of the present invention is to provide a group 13 nitride epitaxial substrate for an HEMT device with which the HEMT device having superior characteristics can be manufactured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph obtained by plotting an electron mobility against an off angle of a base substrate 1 for each of the samples having the same Al concentration of an intermediate layer 3 with respect to Example 1;

FIG. 3 is a graph obtained by plotting the electron mobility against the off angle of the base substrate 1 for each of the samples having the same Al concentration of the intermediate layer 3 with respect to Example 2;

DESCRIPTION OF THE PREFERRED EMBODIMENTS

The group numbers in the Periodic Table shown in the present specification are based on the group number representation from 1 to 18 according to the revised version of Inorganic Chemistry Nomenclature Rules by International Union of Pure and Applied Chemistry (IUPAC), 1989. The group 13 represents aluminum (Al), gallium (Ga), indium (In) and others. The group 14 represents silicon (Si), germanium (Ge), tin (Sn), lead (Pb) and others. The group 15 represents nitrogen (N), phosphorus (P), arsenic (As), antimony (Sb) and others.

Figure 1:
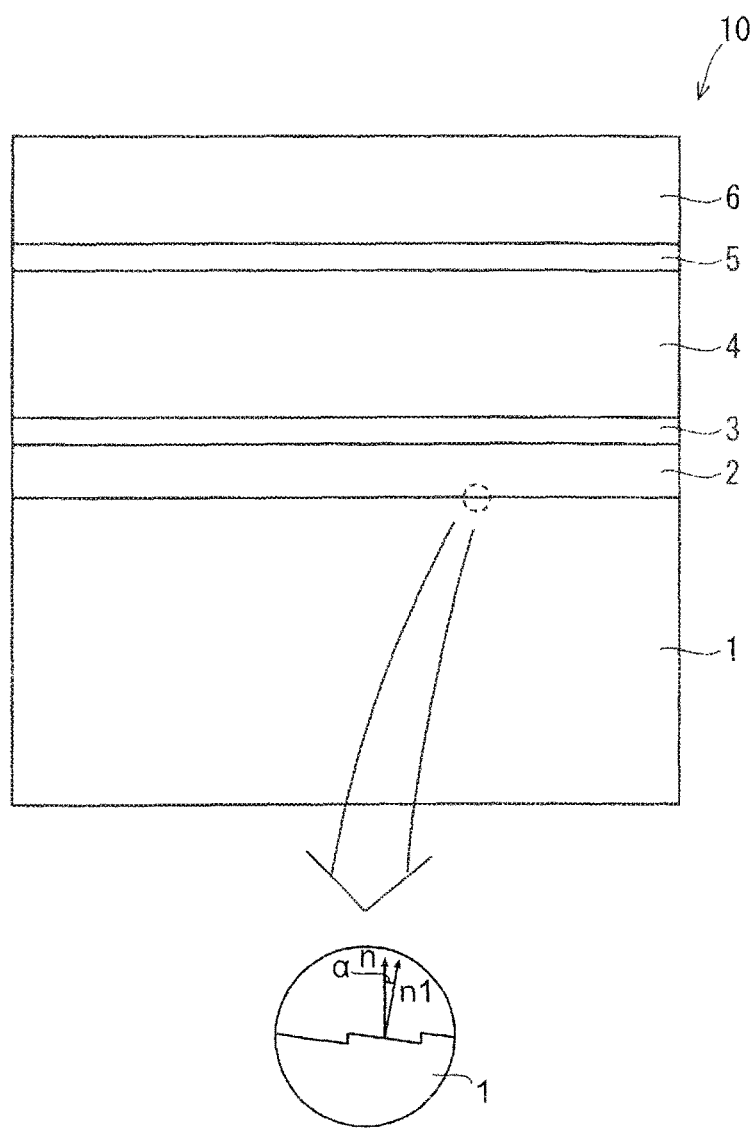
FIG. 1 is a sectional view schematically illustrating a configuration of an epitaxial substrate 10.

FIG. 1 is a sectional view schematically illustrating a configuration of an epitaxial substrate 10 according to a preferred embodiment of the present invention. The epitaxial substrate 10 is a substrate for fabricating an HEMT (high electron mobility transistor) device which is one kind of a semiconductor device. In more detail, the epitaxial substrate 10 is a mother substrate for fabricating an HEMT device with which numerous HEMT devices can be obtained by forming a predetermined electrode pattern (not illustrated in the drawings) on the epitaxial substrate 10 and thereafter cutting and separating the epitaxial substrate 10 into a predetermined size to form individual pieces.

The epitaxial substrate 10 has a configuration in which a nucleation layer 2, an intermediate layer 3, an electron transit layer 4, a spacer layer 5 and a barrier layer 6, each composed of a group 13 nitride, are epitaxially formed in this order on a base substrate 1.

A semi-insulating SiC single crystal substrate is used as the base substrate 1. Specifically, a 6H-SiC substrate or a 4H-SiC substrate exhibiting an n-type conductivity, having a specific resistance of about $10^4$ Ωcm to $10^{10}$ Ωcm, having a (0001) plane orientation and having an off angle α of 0.1° or more and 0.5° or less is used as the base substrate 1. Here, in the present preferred embodiment, the off angle α refers to an angle formed by the normal direction n of the main surface of the base substrate 1 and the normal direction n1 of the (0001) plane.

The thickness of the base substrate 1 is not particularly limited in terms of material quality; however, for the sake of convenience in handling, a substrate having a thickness of several hundred μm to several mm is suitable.

The nucleation layer 2 is a layer composed of AlN and formed to have a thickness of 1 nm to 500 nm. The nucleation layer 2 is a layer provided for improving the crystal quality of each layer formed thereon.

The intermediate layer 3 is a layer composed of a group 13 nitride with the composition $Al_xGa_{1-x}N$ (0.01≤x≤0.4) and formed to have a thickness of 1 nm to 500 nm.

The electron transit layer 4 is a layer composed of a group 13 nitride with the composition $Al_yGa_{1-y}N$ (0≤y<1) and formed to have a thickness of 50 nm to 5000 nm. Preferably, the electron transit layer 4 is formed of GaN.

The spacer layer 5 is a layer composed of AlN and formed to have a thickness of 0.5 nm to 1.5 nm. Providing the spacer layer 5 produces an effect of enhancing confinement of electrons in a two-dimensional electron gas region. However, the spacer layer 5 is not an essential constituent device and may be omitted.

The barrier layer 6 is a layer composed of a group 13 nitride with the composition $In_zAl_{1-z}N$ (0.13≤z≤0.23) and formed to have a thickness of 2 nm to 15 nm or a layer composed of a group 13 nitride with the composition $Al_wGa_{1-w}N$ (0.15≤w≤0.35) and formed to have a thickness of 10 nm to 40 nm. Here, in the case with z<0.13 or w>0.35, microcracks are generated in the barrier layer 6, and an extreme lowering of the electron mobility occurs in the epitaxial substrate 10, so that it is not preferable. In the case with z>0.23 or w<0.15, it is difficult to obtain a sufficient sheet carrier density in the epitaxial substrate 10, and lowering of the drain current amount occurs when an HEMT device is fabricated by using this epitaxial substrate 10, so that it is not preferable.

In the epitaxial substrate 10 having such a configuration, in the case that the spacer layer 5 is not provided, the interface between the electron transit layer 4 and the barrier layer 6 constitutes a heterointerface, whereas in the case that the spacer layer 5 is provided, a region including the spacer layer 5 between the electron transit layer 4 and the barrier layer 6 constitutes a heterointerface region. At the interface or in the interface region, more specifically, in a neighborhood of the interface of the electron transit layer 4 or in a neighborhood of the interface region, a two-dimensional electron gas region where a two-dimensional electron gas is present at a high concentration is formed by the spontaneous polarization effect and the piezoelectric polarization effect. However, the piezoelectric polarization effect is produced in the case that the barrier layer 6 is formed of $Al_wGa_{1-w}N$. Here, the case in which the barrier layer 6 is formed of $In_zAl_{1-z}N$ gives a higher sheet carrier density of the epitaxial substrate 10 than the case in which the barrier layer 6 is formed of $Al_wGa_{1-w}N$. This is because the spontaneous polarization of the former is considerably larger than a sum of the spontaneous polarization and the piezoelectric polarization of the latter. Here, the sheet carrier density of the epitaxial substrate for an HEMT device is in principle affected by the kind, composition, thickness and the like of the barrier layer.

It is suitable that each of the layers disposed on the base substrate 1 is epitaxially formed sequentially by using the MOCVD method (metal organic chemical vapor deposition method). Specifically, each layer can be epitaxially grown by using a known MOCVD furnace that is constituted so as to be capable of supplying an organic metal (MO) source material gas (TMI, TMA, TMG) for In, Al, Ga as well as an ammonia gas, a hydrogen gas and a nitrogen gas into a reactor.

In other words, the nucleation layer 2, the intermediate layer 3, the electron transit layer 4, the spacer layer 5 and the barrier layer 6 can be sequentially formed by placing the base substrate 1 on a susceptor provided in the reactor and supplying one or more kinds of gas selected in accordance with the composition of each layer from TMG, TMA, TMI, more specifically a gas obtained by bubbling these, and an ammonia gas respectively in a predetermined supplying ratio that accords to the composition of each layer, together with a carrier gas into the reactor in a state in which the temperature of the base substrate is sequentially kept at a temperature of forming that is determined in advance for each layer.

For example, it is suitable that each layer is grown under the following conditions. Here, in the present preferred embodiment, the group 15/group 13 gas ratio refers to a ratio of the supplying amount of the ammonia gas, which is a group 15 source material, relative to the supplying amount of the group 13 source material gas (TMI, TMA, TMG) as represented in a molar ratio. Also, in the following, the temperature of forming refers to the susceptor heating temperature.

Nucleation layer 2:
Temperature of forming→1000° C. to 1200° C.;
Pressure within reactor→3 kPa to 30 kPa;
Source material carrier gas→hydrogen;
Group 15/Group 13 gas ratio→5000 to 20000.
  Intermediate layer 3:
Temperature of forming→1000° C. to 1200° C.;
Pressure within reactor→3 kPa to 30 kPa;
Source material carrier gas→hydrogen;
Group 15/Group 13 gas ratio→1000 to 5000.
  Electron transit layer 4:
Temperature of forming→1000° C. to 1200° C.;
Pressure within reactor→30 kPa to 105 kPa;
Source material carrier gas→hydrogen;
Group 15/Group 13 gas ratio→1000 to 5000.
  Spacer layer 5:
Temperature of forming→1000° C. to 1200° C.;
Pressure within reactor→3 kPa to 30 kPa;
Source material carrier gas→hydrogen;
Group 15/Group 13 gas ratio→10000 to 50000.
  Barrier layer 6←in the case of forming with $In_zAl_{1-z}N$:
Temperature of forming→700° C. to 900° C.;
Pressure within reactor→3 kPa to 30 kPa;
Source material carrier gas→nitrogen;
Group 15/Group 13 gas ratio→5000 to 20000.
  Barrier layer 6←in the case of forming with $Al_wGa_{1-w}N$:
Temperature of forming→1000° C. to 1200° C.;
Pressure within reactor→3 kPa to 30 kPa;
Source material carrier gas→hydrogen;
Group 15/Group 13 gas ratio→5000 to 20000.

The epitaxial substrate 10 according to the present preferred embodiment that is formed in such a manner is, as described above, characterized in that a substrate composed of (0001) plane SiC and having an off angle of 0.1° or more and 0.5° or less is used as the base substrate 1 and further that the intermediate layer 3 composed of a group 13 nitride with the composition $Al_xGa_{1-x}N$ (0.01≤x≤0.4) is provided between the nucleation layer 2 and the electron transit layer 4. By being provided with both of these requirements, the epitaxial substrate 10 has a high electron mobility of about 1300 $cm^2V^{-1}s^{-1}$ or more. This is a value equal to or more than a double of the electron mobility that is realized in an epitaxial substrate that is not provided with an intermediate layer though using a base substrate having an off angle. Here, the value of the electron mobility of 1300 $cm^2V^{-1}s^{-1}$ corresponds to an upper limit value of the electron mobility that is realized when various kinds of group 13 nitride epitaxial substrates for an HEMT device are fabricated using a (0001) plane sapphire substrate as the base substrate. Therefore, the fact that the electron mobility is 1300 $cm^2V^{-1}s^{-1}$ or more means that the epitaxial substrate has an extremely superior electron mobility.

Thus, it is a knowledge found out for the first time by the inventors of the present invention that a combination of the requirement that the base substrate 1 has an off angle within the above-described range and the requirement that the intermediate layer 3 having a composition within the above-described range is provided between the nucleation layer 2 and the electron transit layer 4 produces an effect in realizing an extremely high electron mobility of 1300 $cm^2V^{-1}s^{-1}$ or more.

Also, by using the epitaxial substrate 10 according to the present preferred embodiment having a superior electron mobility such as this, an HEMT device having superior characteristics, for example, an HEMT device having a high maximum drain current, can be fabricated.

As described above, according to the present preferred embodiment, an epitaxial substrate for fabricating an HEMT device having a superior electron mobility can be obtained, and further an HEMT device having superior characteristics can be obtained by using a (0001) plane SiC substrate having an off angle of 0.1° or more and 0.5° or less as the base substrate and providing an intermediate layer composed of a group 13 nitride with the composition $Al_xGa_{1-x}N$ (0.01≤x≤0.4) between the nucleation layer that are disposed immediately above the base substrate and the electron transit layer in the epitaxial substrate for fabricating the HEMT device in which the electron transit layer and the barrier layer form a heterojunction interface region on the base substrate.

EXAMPLES

As Examples 1 to 3, epitaxial substrates 10 having various configurations were fabricated by the MOCVD method, and the electron mobility and the sheet carrier density were evaluated for each of the epitaxial substrates 10. Also, HEMT devices were fabricated using the respective obtained epitaxial substrates 10, and the maximum drain current thereof was measured.

In Example 1, 30 kinds of epitaxial substrates 10 in all were fabricated by making the off angle of the base substrate 1 differ at 5 levels of 0.05°, 0.1°, 0.3°, 0.5° and 0.7° and further by making the Al concentration, which is the value of x in $Al_xGa_{1-x}N$ in the intermediate layer 3, differ at 6 levels of 0.005, 0.01, 0.03, 0.3, 0.4 and 0.6 while fixing the composition, the thickness and the fabricating conditions of the base substrate 1, the nucleation layer 2, the intermediate layer 3, the electron transit layer 4, the spacer layer 5 and the barrier layer 6 in all of the samples in the following manner.

Ground substrate 1:
Composition→semi-insulating (0001) plane 4H-SiC;
Thickness→350 μm.
  Nucleation layer 2:
Composition→AlN;
Thickness→200 nm;
Temperature of forming→1100° C.;
Pressure within reactor→10 kPa;
Source material carrier gas→hydrogen;
Group 15/Group 13 gas ratio→10000.
  Intermediate layer 3:
Composition→AlGaN;
Thickness→10 nm;
Temperature of forming→1100° C.;
Pressure within reactor→10 kPa;
Source material carrier gas→hydrogen;
Group 15/Group 13 gas ratio→2000;
TMA/(TMA+TMG) gas ratio→0.005, 0.01, 0.03, 0.3, 0.4, 0.6 in the order of increasing x.
  Electron transit layer 4:
Composition→GaN;
Thickness→1000 nm;
Temperature of forming→1100° C.;
Pressure within reactor→100 kPa;
Source material carrier gas→hydrogen;
Group 15/Group 13 gas ratio→2000.
  Spacer layer 5:
Composition→AlN;
Thickness→1 nm;
Temperature of forming→1100° C.;
Pressure within reactor→10 kPa;

Source material carrier gas→hydrogen;
Group 15/Group 13 gas ratio→30000.

Barrier layer 6:
Composition→$In_{0.18}Al_{0.82}N$;
Thickness→10 nm;
Temperature of forming→800° C.;
Pressure within reactor→10 kPa;
Source material carrier gas→nitrogen;
Group 15/Group 13 gas ratio→10000.

Also, in Example 2, 30 kinds of epitaxial substrates 10 in all were fabricated by setting the off angle of the base substrate 1 and the Al concentration of the intermediate layer 3 in the same manner as in Example 1 while fixing the composition, the thickness and the fabricating conditions of the base substrate 1, the nucleation layer 2, the intermediate layer 3, the electron transit layer 4, the spacer layer 5 and the barrier layer 6 in all of the samples in the following manner.

Ground substrate 1:
Composition→semi-insulating (0001) plane 6H-SiC;
Thickness→400 µm.

Nucleation layer 2:
Composition→AlN;
Thickness→10 nm;
Temperature of forming→1050° C.;
Pressure within reactor→5 kPa;
Source material carrier gas→hydrogen;
Group 15/Group 13 gas ratio→7500.

Intermediate layer 3:
Composition→$Al_xGa_{1-x}N$;
Thickness→100 nm;
Temperature of forming→1050° C.;
Pressure within reactor→5 kPa;
Source material carrier gas→hydrogen;
Group 15/Group 13 gas ratio→1500;
TMA/(TMA+TMG) gas ratio→0.005, 0.01, 0.03, 0.3, 0.4, 0.6 in the order of increasing x.

Electron transit layer 4:
Composition→GaN;
Thickness→2000 nm;
Temperature of forming→1050° C.;
Pressure within reactor→50 kPa;
Source material carrier gas→hydrogen;
Group 15/Group 13 gas ratio→4000.

Spacer layer 5:
Composition→AlN;
Thickness→1 nm;
Temperature of forming→1050° C.;
Pressure within reactor→5 kPa;
Source material carrier gas→hydrogen;
Group 15/Group 13 gas ratio→10000.

Barrier layer 6:
Composition→$In_{0.15}Al_{0.85}N$;
Thickness→8 nm;
Temperature of forming→810° C.;
Pressure within reactor→5 kPa;
Source material carrier gas→nitrogen;
Group 15/Group 13 gas ratio→5000.

Further, in Example 3, 30 kinds of epitaxial substrates 10 in all were fabricated without providing the spacer layer 5 and by setting the off angle of the base substrate 1 and the Al concentration of the intermediate layer 3 in the same manner as in Example 1 while fixing the composition, the thickness and the fabricating conditions of the base substrate 1, the nucleation layer 2, the intermediate layer 3, the electron transit layer 4 and the barrier layer 6 in all of the samples in the following manner.

Ground substrate 1:
Composition→semi-insulating (0001) plane 4H-SiC;
Thickness→350 µm.

Nucleation layer 2:
Composition→AlN;
Thickness→100 nm;
Temperature of forming→1150° C.;
Pressure within reactor→15 kPa;
Source material carrier gas→hydrogen;
Group 15/Group 13 gas ratio→15000.

Intermediate layer 3:
Composition→$Al_xGa_{1-x}N$;
Thickness→1 nm;
Temperature of forming→1150° C.;
Pressure within reactor→15 kPa;
Source material carrier gas→hydrogen;
Group 15/Group 13 gas ratio→3000;
TMA/(TMA+TMG) gas ratio→0.005, 0.01, 0.03, 0.3, 0.4, 0.6 in the order of increasing x.

Electron transit layer 4:
Composition→GaN;
Thickness→3000 nm;
Temperature of forming→1150° C.;
Pressure within reactor→100 kPa;
Source material carrier gas→hydrogen;
Group 15/Group 13 gas ratio→1000.

Barrier layer 6:
Composition→$Al_{0.2}Ga_{0.8}N$;
Thickness→20 nm;
Temperature of forming→1150° C.;
Pressure within reactor→15 kPa;
Source material carrier gas→hydrogen;
Group 15/Group 13 gas ratio→10000.

With respect to the obtained 90 kinds of epitaxial substrates 10 in all in Examples 1 to 3, the electron mobility and the sheet carrier density were measured by Hall measurement according to the van der Pauw method.

Further, an HEMT device was fabricated experimentally by using each epitaxial substrate. Specifically, a Ti/Al/Ni/Au multilayer film was formed by vapor deposition as an ohmic electrode on each epitaxial substrate, and a Pd/Ti/Au multilayer film was formed by vapor deposition as a Schottky electrode. The thickness of the layers in the Ti/Al/Ni/Au multilayer film was set to be 15/75/15/40 nm sequentially in this order. Also, the thickness of the layers in the Pd/Ti/Au multilayer film was set to be 40/20/60 nm sequentially in this order. Also, the gate length was set to be 2 µm, and the gate width was set to be 15 µm. Device separation between the respective HEMT devices was carried out by RIE (reactive ion etching) using a chlorine-based gas, and a $SiO_2$ film serving as a protective film was formed by sputtering on each device surface.

Figure 4:
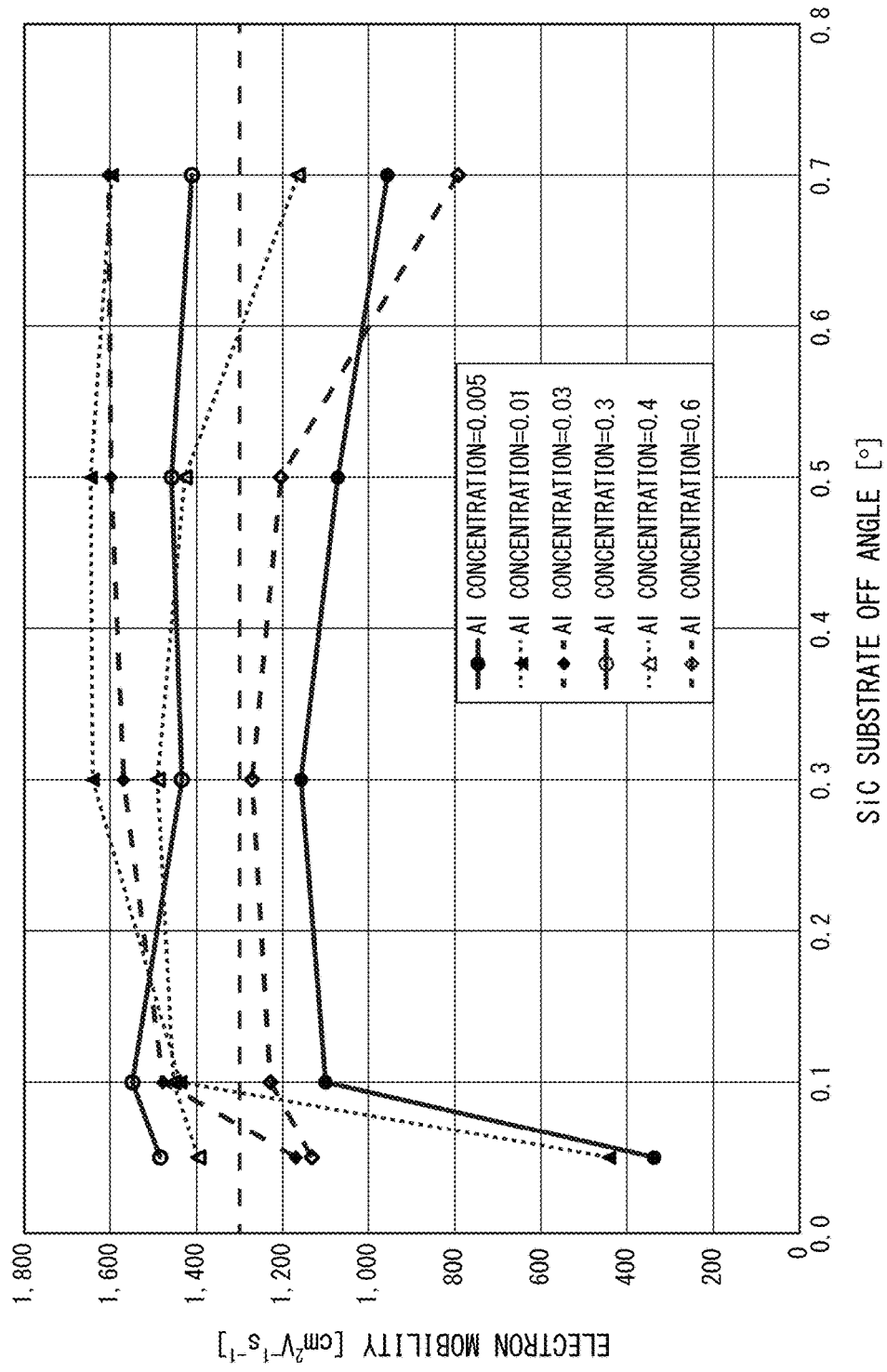
FIG. 4 is a graph obtained by plotting the electron mobility against the off angle of the base substrate 1 for each of the samples having the same Al concentration of the intermediate layer 3 with respect to Example 3.

FIGS. 2, 3, and 4 each show a graph obtained by plotting the electron mobility against the off angle of the base substrate 1 for each of the samples having the same Al concentration of the intermediate layer 3 with respect to Examples 1, 2, and 3, respectively. However, in each of FIGS. 2, 3, and 4, the off angle in the base substrate 1 is denoted as "SiC substrate off angle". Also, a broken line is drawn at the level at which the electron mobility is 1300 $cm^2V^{-1}s^{-1}$.

From FIGS. 2, 3, and 4, it will be understood that a high electron mobility of 1300 $cm^2V^{-1}s^{-1}$ or more is obtained when the off angle of the base substrate 1 is set to be 0.1° or more and 0.5° or less and the Al concentration in the intermediate layer 3 is set to be 0.1 or more and 0.4 or less, though the other layer configurations are made to differ. This means that setting the off angle of the base substrate 1 to be 0.1° or more and 0.5° or less and setting the Al concentration in the intermediate layer 3 to be 0.1 or more and 0.4 or less produces an effect of increasing the electron mobility in the epitaxial substrate 10.

Figure 5:
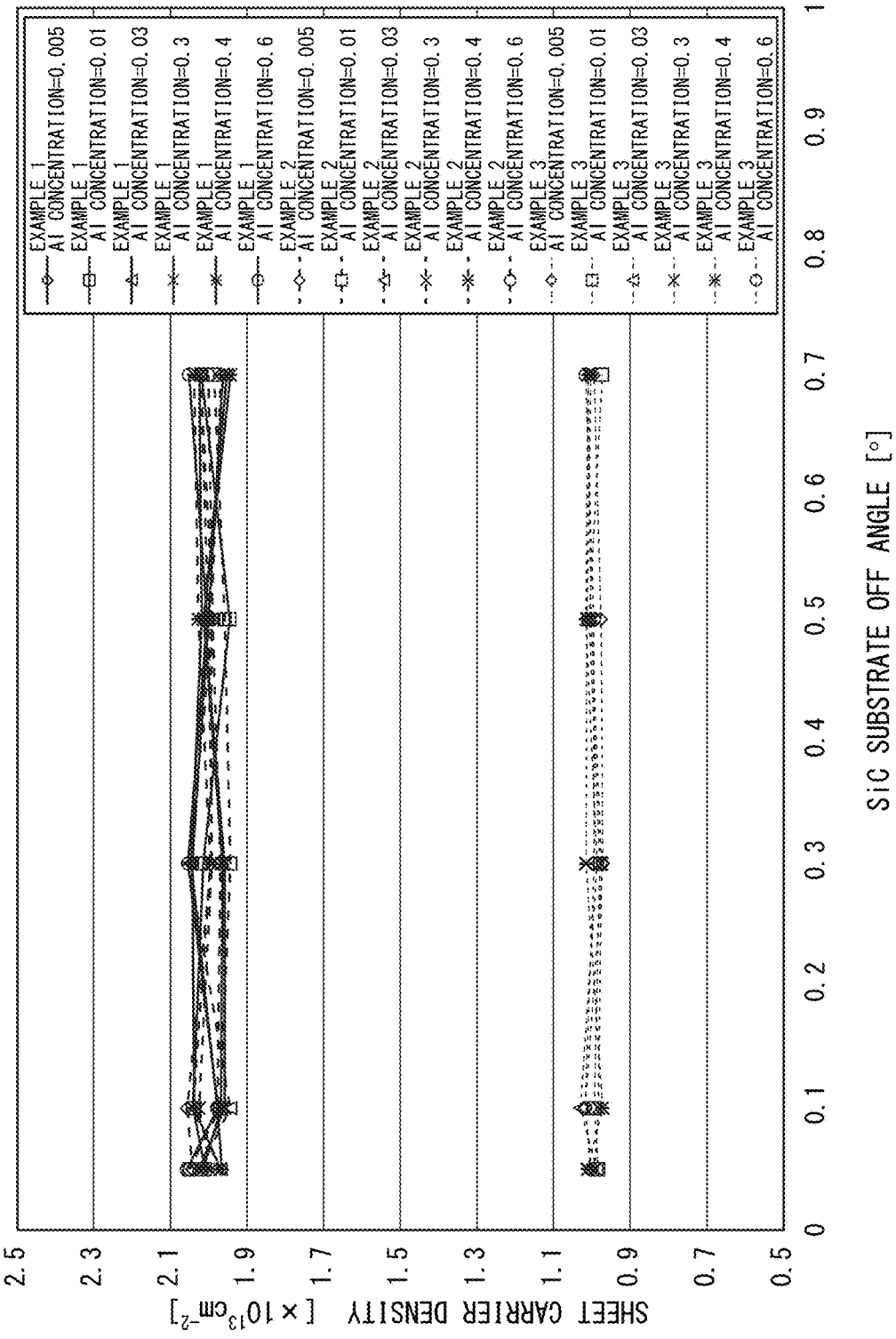
FIG. 5 is a graph obtained by plotting a sheet carrier density against the off angle of the base substrate 1 for each of the samples having the same Al concentration of the intermediate layer 3 with respect to all of the samples in Examples 1 to 3.
Figure 6:
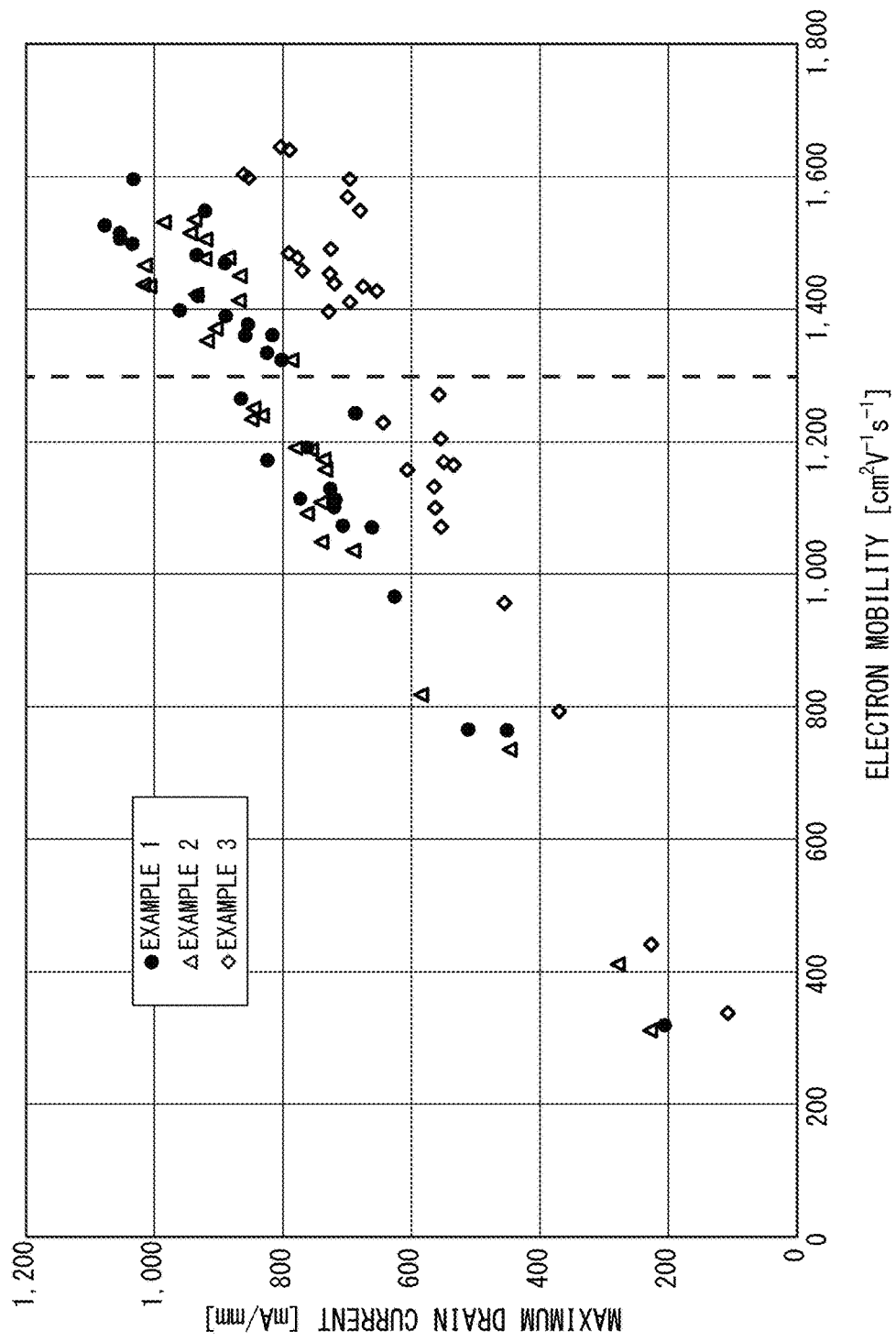
FIG. 6 is a graph obtained by plotting a maximum drain current of an HEMT device against the electron mobility for all of the samples in Examples 1 to 3.

Also, FIG. 5 is a graph obtained by plotting the sheet carrier density against the off angle of the base substrate 1 for each of the samples having the same Al concentration of the intermediate layer 3 with respect to all of the samples in Examples 1 to 3. However, in FIG. 5 as well, the off angle in the base substrate 1 is denoted as "SiC substrate off angle". Further, FIG. 6 is a graph obtained by plotting the maximum drain current of the HEMT device against the electron mobility for all of the samples in Examples 1 to 3. In FIG. 6, a broken line is drawn at the level at which the electron mobility is 1300 $cm^2V^{-1}s^{-1}$.

Referring to FIG. 5, in Examples 1 and 2, the sheet carrier density had an approximately constant value of around $2 \times 10^{13}$ $cm^{-2}$ irrespective of the off angle of the base substrate 1 and the Al concentration of the intermediate layer 3. Also, in Example 3, the sheet carrier density had an approximately constant value of around $1 \times 10^{13}$ $cm^{-2}$. In other words, though the sheet carrier density was varied among the examples, there was no dependency of the sheet carrier density on the off angle of the base substrate 1 and the Al concentration of the intermediate layer 3.

In the meantime, from FIG. 6, it is confirmed that, in all of the Examples, the maximum drain current is positively correlated to the electron mobility and that Examples 1 and 2 obtained by forming the barrier layer 6 with $In_zAl_{1-z}$ and providing the spacer layer 5 tend to give a higher maximum drain current than Example 3 obtained by forming the barrier layer 6 with $Al_wGa_{1-w}N$.

Specifically, when the electron mobility is 1300 $cm^2$ $V^{-1}s^{-1}$ or more, a maximum drain current of 600 mA/mm or more is realized in the HEMT device that is not provided with the spacer layer 5, whereas a maximum drain current of 750 mA/mm or more is realized in the HEMT device that is provided with the spacer layer 5.

Figure 7:
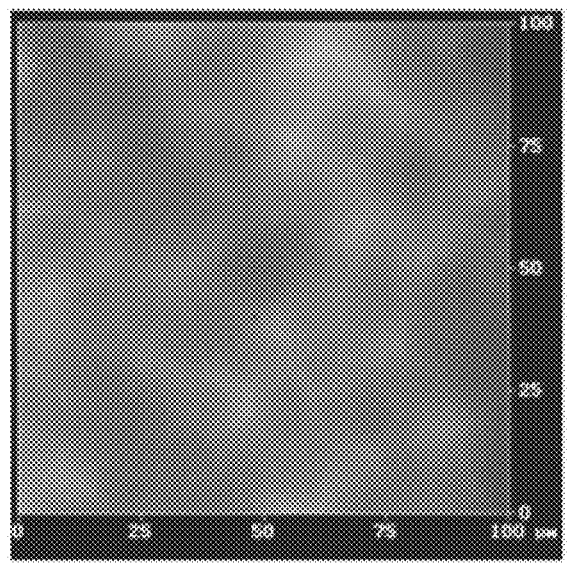
FIG. 7 is an AFM image of a surface of the epitaxial substrate 10 in which the off angle of the base substrate 1 is 0.1° and the Al concentration of the intermediate layer 3 is 0.3 in Example 1.

Also, FIG. 7 is an AFM image of a surface of the epitaxial substrate 10, more specifically a surface of the barrier layer 6, in which the off angle of the base substrate 1 is 0.1° and the Al concentration of the intermediate layer 3 is 0.3 in Example 1. On the other hand, FIG. 8 is an AFM image of a surface of an epitaxial substrate fabricated under the same conditions as in the epitaxial substrate 10 of FIG. 7 except that the intermediate layer 3 is not provided, for the sake of comparison.

Figure 8:
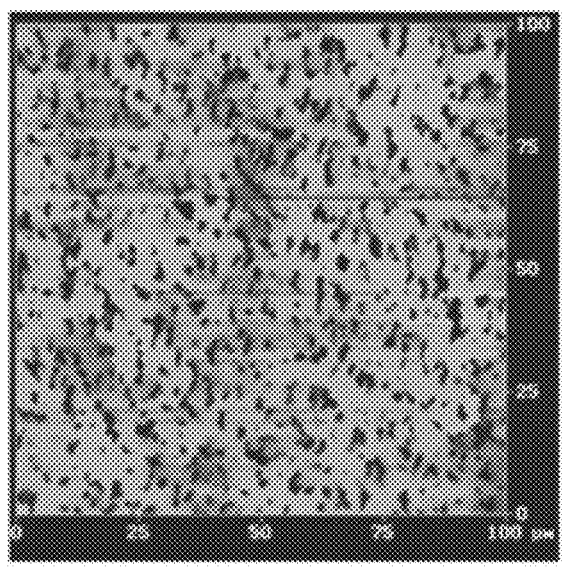
FIG. 8 is an AFM image of a surface of an epitaxial substrate fabricated under the same conditions as in the epitaxial substrate 10 of FIG. 7 except that the intermediate layer 3 is not provided.

In the AFM image of FIG. 8, numerous pits are confirmed on the substrate surface. The pits are recognized as black points on the drawing. In contrast, such pits are not seen in the AFM image of FIG. 7, and it has been confirmed that the substrate surface has a good flatness. Such a difference shows that providing the intermediate layer 3 produces an effect of improving the flatness on the surface of the epitaxial substrate 10, more specifically on the surface of the barrier layer 6. Further, by considering the results shown in FIG. 2 and others in combination, it seems that providing the intermediate layer 3 in order to realize a surface having a high flatness without generation of pits produces an effect in improving the electron mobility of the epitaxial substrate 10.

While the invention has been shown and described in detail, the foregoing description is in all aspects illustrative and not restrictive. It is therefore understood that numerous modifications and variations can be devised without departing from the scope of the invention.

What is claimed is:

1. An epitaxial substrate for a HEMT device A composition comprising
    a base substrate composed of SiC and having a main surface with a (0001) plane orientation;
    a nucleation layer formed on one main surface of said base substrate and composed of AlN;
    an electron transit layer formed on said nucleation layer and composed of a group 13 nitride with a composition of $Al_yGa_{1-y}N(0 \le y \le 1)$;
    a spacer layer formed on said electron transit layer; and
    a barrier layer formed on said electron transit layer and composed of a group 13 nitride with a composition $In_zAl_{1-z}N$ (0.13≤z≤0.23) or $Al_wGa_{1-w}N$ (0.15≤w≤0.35), wherein
    a (0001) plane of said base substrate has an off angle of 0.1° or more and 0.5° or less, and
    an intermediate layer composed of a group 13 nitride with a composition $Al_xGa_{1-x}N$ (0.01≤x≤0.4) is further provided between said nucleation layer and said electron transit layer.

2. The composition according to claim 1, wherein a spacer layer composed of AlN is further provided between said electron transit layer and said barrier layer.

3. The composition according to claim 1, wherein said electron transit layer is composed of GaN.

4. The device according to claim 2, wherein said electron transit layer is composed of GaN.

5. A method for manufacturing a device, comprising steps of:
    a) epitaxially forming a nucleation layer composed of AlN on one main surface of a base substrate composed of SiC and having a main surface with a (0001) plane orientation;
    b) epitaxially forming an intermediate layer composed of a group 13 nitride with a composition $Al_xGa_{1-x}N$ (0.01<x <0.4) on said nucleation layer;
    c) epitaxially forming an electron transit layer composed of a group 13 nitride with a composition $Al_yGa_{1-y}N$ (0<y <1) on said intermediate layer;
    a spacer layer formed on said electron transit layer; and
    d) epitaxially forming a barrier layer composed of a group 13 nitride with a composition $In_zAl_{1-z}N$ (0.13<z <0.23) or $Al_wGa_{1-w}N$ (0.15<w <0.35) on said electron transit layer, wherein
    a substrate whose (0001) plane has an off angle of 0.1° or more and 0.5° or less is used as said base substrate.

6. The method for manufacturing a device according to claim 5, further comprising a step of:
    e) epitaxially forming a spacer layer composed of AlN on said electron transit layer, wherein said barrier layer is formed on said spacer layer in said step d).

7. The method for manufacturing a device according to claim 5, wherein said electron transit layer is formed of GaN in said step c).

8. The method for manufacturing a device according to claim 6, wherein said electron transit layer is formed of GaN in said step c).

* * * * *

UNITED STATES PATENT AND TRADEMARK OFFICE
CERTIFICATE OF CORRECTION

Page 1 of 2

PATENT NO. : 10,332,975 B2
APPLICATION NO. : 15/468309
DATED : June 25, 2019
INVENTOR(S) : Mikiya Ichimura et al.

It is certified that error appears in the above-identified patent and that said Letters Patent is hereby corrected as shown below:

In the Claims

Beginning at Column 10, Line 5, and ending at Column 10, Line 61, please amend the Claims as follows:

1. A composition comprising:
    a base substrate composed of SiC and having a main surface with a (0001) plane orientation;
    a nucleation layer formed on one main surface of said base substrate and composed of AlN;
    an electron transit layer formed on said nucleation layer and composed of a group 13 nitride with a composition $Al_yGa_{1-y}N$ ($0 \leq y < 1$);
    a spacer layer formed on said electron transit layer; and
    a barrier layer formed on said electron transit layer and composed of a group 13 nitride with a composition $In_zAl_{1-z}N$ ($0.13 \leq z \leq 0.23$) or $Al_wGa_{1-w}N$ ($0.15 \leq w \leq 0.35$), wherein
    a (0001) plane of said base substrate has an off angle of 0.1° or more and 0.5° or less, and
    an intermediate layer composed of a group 13 nitride with a composition $Al_xGa_{1-x}N$ ($0.01 \leq x \leq 0.4$) is further provided between said nucleation layer and said electron transit layer.

2. The composition according to claim 1, wherein the spacer layer is composed of AlN.

3. The composition according to claim 1, wherein said electron transit layer is composed of GaN.

4. A method for manufacturing a device, comprising steps of:
    a) epitaxially forming a nucleation layer composed of AlN on one main surface of a base substrate composed of SiC and having a main surface with a (0001) plane orientation;
    b) epitaxially forming an intermediate layer composed of a group 13 nitride with a composition $Al_{1-x}Ga_{1-x}N$ ($0.01 \leq x \leq 0.4$) on said nucleation layer;

Signed and Sealed this
Fifth Day of May, 2020

Andrei Iancu
*Director of the United States Patent and Trademark Office* c) epitaxially forming an electron transit layer composed of a group 13 nitride with a composition $Al_yGa_{1-y}N$ ($0 \leq y \leq 1$) on said intermediate layer;

d) forming_a spacer layer on said electron transit layer; and e) epitaxially forming a barrier layer composed of a group 13 nitride with a composition $In_zAl_{1-z}N$ ($0.13 \leq z \leq 0.23$) or $Al_wGa_{1-w}N$ ($0.15 \leq w \leq 0.35$) on said electron transit layer, wherein a substrate whose (0001) plane has an off angle of 0.1° or more and 0.5° or less is used as said base substrate.

5. The method for manufacturing the device according to claim 4, further comprising a step of:

f) epitaxially forming a spacer layer composed of AlN on said electron transit layer, wherein said barrier layer is formed on said spacer layer in said step e).

6. The method for manufacturing the device according to claim 4, wherein said electron transit layer is formed of GaN in said step c).

7. The composition according to claim 2, wherein said electron transit layer is composed of GaN.

8. The method for manufacturing the device according to claim 5, wherein said electron transit layer is formed of GaN in said step c).